(12) United States Patent
Kiers et al.

(10) Patent No.: US 11,966,168 B2
(45) Date of Patent: *Apr. 23, 2024

(54) METHOD OF MEASURING VARIATION, INSPECTION SYSTEM, COMPUTER PROGRAM, AND COMPUTER SYSTEM

(71) Applicant: ASML NETHERLANDS B.V., Veldhoven (NL)

(72) Inventors: Antoine Gaston Marie Kiers, Veldhoven (NL); Scott Anderson Middlebrooks, Duizel (NL); Jan-Willem Gemmink, Riethoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/484,081

(22) Filed: Sep. 24, 2021

(65) Prior Publication Data

US 2022/0011680 A1 Jan. 13, 2022

Related U.S. Application Data

(63) Continuation of application No. 16/486,169, filed as application No. PCT/EP2018/053031 on Feb. 7, 2018, now Pat. No. 11,131,936.

(30) Foreign Application Priority Data

Feb. 24, 2017 (EP) .................................... 17157931

(51) Int. Cl.
- *G03F 7/00* (2006.01)
- *G01N 21/95* (2006.01)
- *G01N 21/956* (2006.01)

(52) U.S. Cl.
CPC ..... *G03F 7/70625* (2013.01); *G01N 21/9501* (2013.01); *G01N 21/956* (2013.01);
(Continued)

(58) Field of Classification Search
CPC .... G03F 7/70625; G03F 7/0002; G03F 7/705; G01N 21/9501; G01N 21/956;
(Continued)

(56) References Cited

U.S. PATENT DOCUMENTS 6,647,147 B1 * 11/2003 Miyano ............... G03F 7/70625
382/256
2008/0056558 A1 * 3/2008 Mitsui ....................... G06T 7/13
382/144

(Continued)

FOREIGN PATENT DOCUMENTS

| CN | 101135556 | 3/2008 |
| JP | 2005156436 | 6/2005 |

(Continued)

OTHER PUBLICATIONS

Korean Office Action issued in corresponding Korean Patent Application No. 10-2021-7026324, dated Oct. 8, 2021.
(Continued)

*Primary Examiner* — Gary Collins
(74) *Attorney, Agent, or Firm* — Pillsbury Winthrop Shaw Pittman LLP

(57) ABSTRACT

Methods of measuring variation across multiple instances of a pattern on a substrate or substrates after a step in a device manufacturing process are disclosed. In one arrangement, data representing a set of images is received. Each image represents a different instance of the pattern. The set of images are registered relative to each other to superimpose the instances of the pattern. Variation in the pattern is measured using the registered set of images. The pattern comprises a plurality of pattern elements and the registration comprises applying different weightings to two or more of the plurality of pattern elements. The weightings control the extent to which each pattern element contributes to the registration of the set of images. Each weighting is based on
(Continued)

an expected variation of the pattern element to which the weighting is applied.

20 Claims, 8 Drawing Sheets

(52) U.S. Cl.
CPC ............ *G03F 7/0002* (2013.01); *G03F 7/705* (2013.01); *G06T 2207/30148* (2013.01); *H01J 2237/2817* (2013.01)

(58) Field of Classification Search
CPC ......... G06V 10/245; G06T 2207/30148; H01J 2237/2817
See application file for complete search history.

(56) References Cited

U.S. PATENT DOCUMENTS

| 2008/0128644 | A1 | 6/2008 | Mos et al. | |
|---|---|---|---|---|
| 2009/0309022 | A1* | 12/2009 | Gunji | H01J 37/28 |
| | | | | 250/311 |
| 2010/0104128 | A1 | 4/2010 | Arnz et al. | |
| 2013/0216121 | A1* | 8/2013 | Sasajima | G06K 9/00523 |
| | | | | 382/145 |
| 2013/0254724 | A1* | 9/2013 | Parikh | G06F 30/00 |
| | | | | 716/53 |
| 2014/0023265 | A1 | 1/2014 | Kitazawa et al. | |
| 2016/0283617 | A1* | 9/2016 | Bailey | G06F 30/20 |

FOREIGN PATENT DOCUMENTS

| KR | 20080049670 | 6/2008 |
|---|---|---|
| TW | 200837506 | 9/2008 |

OTHER PUBLICATIONS

International Search Report and Written Opinion issued in corresponding PCT Patent Application No. PCT/EP2018/053031, dated May 6, 2018.
Taiwanese Office Action issued in corresponding Taiwanese Patent Application No. 107105873, dated Oct. 15, 2018.
Korean Office Action issued in corresponding Korean Patent Application No. 10-2021-7026324, dated Apr. 1, 2022.

* cited by examiner

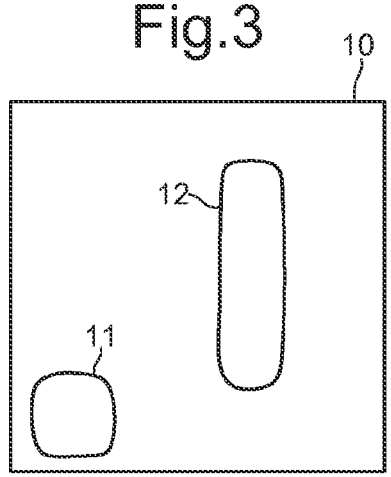
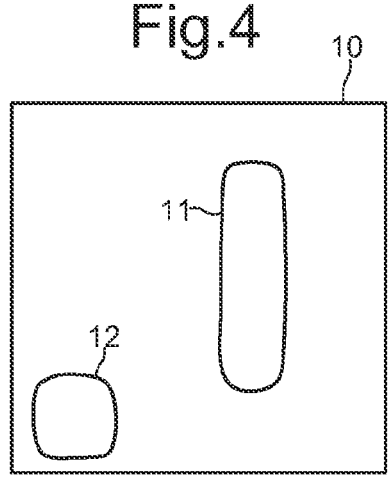
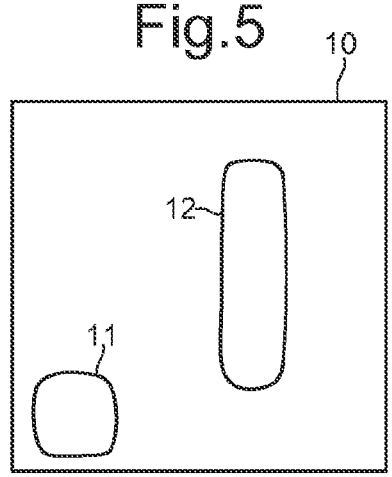
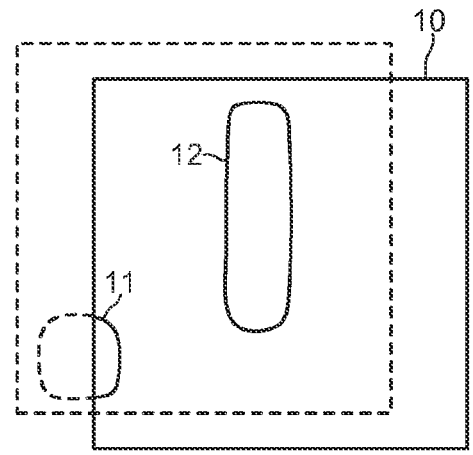
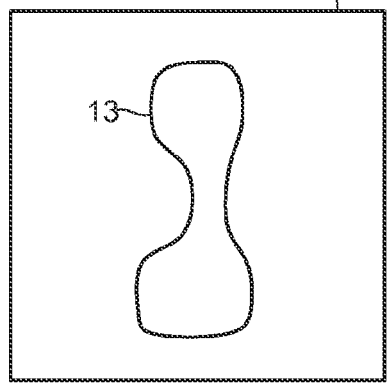
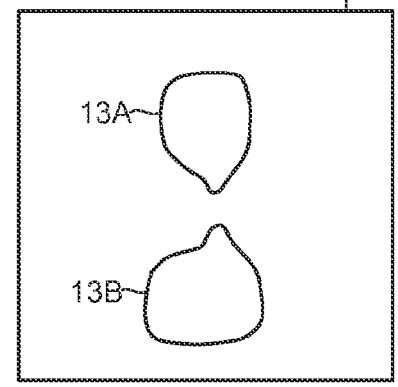

METHOD OF MEASURING VARIATION, INSPECTION SYSTEM, COMPUTER PROGRAM, AND COMPUTER SYSTEM

This application is a continuation of U.S. patent application Ser. No. 16/486,169 which was filed on Aug. 15, 2019, now allowed, which is the U.S. national phase entry of PCT Patent Application No. PCT/EP2018/053031 which was filed on Feb. 7, 2018, which claims the benefit of priority of European Patent Application No. 17157931.1, which was filed on Feb. 24, 2017, each of which is incorporated herein in its entirety by reference.

FIELD

The present disclosure relates to measuring variation between different instances of a pattern on a substrate or substrates, particularly in the context of lithography.

BACKGROUND

A lithographic apparatus is a machine that applies a desired pattern onto a substrate, usually onto a target portion of the substrate. A lithographic apparatus can be used in one or more stages of a device manufacturing process, such as in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor a device manufacturing process, parameters of the patterned substrate (and therefore of any aspect of the device manufacturing process that affects the patterned substrate) are measured. Parameters may include features of pattern shapes (including 1D and 2D shapes), for example critical dimension (typically linewidth) of developed photosensitive resist and/or etched product features. Parameters may include feature heights and/or feature pitches. Parameters may further include line edge roughness and line width roughness. These measurements may be performed on a product substrate and/or on a dedicated metrology target. There are various techniques for making measurements of the microscopic structures formed in lithographic processes, including the use of scanning electron microscopes (SEMs) and various specialized tools.

It is also desirable to monitor variation of parameters of the patterned substrate at different positions on the substrate and between different substrates. Such variation can be monitored by comparing images of multiple instances of a pattern, for example a nominally identical pattern, on the substrate or on different substrates. A set of such images are registered (aligned) relative to each other and deviations between the different images can be identified and quantified.

Existing methods for assessing variation across multiple instances of a pattern have been found to be unreliable.

SUMMARY

It is desirable to provide improved methods for measuring variation across multiple instances of a pattern.

According to an aspect of the invention, there is provided a method of measuring variation across multiple instances of a pattern on a substrate or substrates after a step in a device manufacturing process, comprising:
  receiving data representing a set of images, each image representing a different instance of the pattern;
  registering the set of images relative to each other to superimpose the instances of the pattern; and
  measuring variation in the pattern using the registered set of images, wherein:
  the pattern comprises a plurality of pattern elements and the registration of the set of images comprises applying different weightings to two or more of the plurality of pattern elements, the weightings controlling the extent to which each pattern element contributes to the registration of the set of images; and
  each weighting is based on an expected variation of the pattern element to which the weighting is applied.

According to another aspect of the invention, there is provided a method of measuring variation across multiple instances of a pattern on a substrate or substrates after a step in a device manufacturing process, comprising: receiving data representing a set of images, each image representing a different instance of the pattern; registering the set of images relative to each other to superimpose the instances of the pattern; and
  measuring variation in the pattern using the registered set of images, wherein: each image in the received set of images is delimited by a boundary box;
  the registration of the set of images comprises setting a common boundary box for the set of images based on an intersection between the boundary boxes of the received set of images; and
  the registration of the set of images is performed using all pixels within the common boundary box for each image.

According to another aspect of the invention, there is provided a method of registering a pattern in one or more images, the pattern comprising a plurality of pattern elements, each pattern element having a weighting that controls the extent to which the pattern element contributes to the registration of the pattern, the method comprising: determining a variation in at least one pattern element using a model describing a patterning process for creating the pattern; and determining a weighting associated with the at least one pattern element based on the determined variation in the pattern element.

According to another aspect of the invention, there is provided an inspection system for measuring variation across multiple instances of a pattern on a substrate or substrates after a step in a device manufacturing process, comprising:
  an image acquisition device configured to perform an imaging operation on a substrate or plurality of substrates to obtain a set of images, each image representing a different instance of the pattern; and a computer system configured to: register the set of images relative to each other to superimpose the instances of the pattern; and measure variation in the pattern using the registered set of images, wherein: the pattern comprises a plurality of pattern elements and the registration of the set of images comprises applying different weightings to two or more of the plurality of pattern elements, the weightings controlling the extent to which each pattern element contributes to the registration of the set of images; and each weighting is based on an expected variation of the pattern element to which the weighting is applied.

According to another aspect of the invention, there is provided an inspection system for measuring variation across multiple instances of a pattern on a substrate or substrates after a step in a device manufacturing process, the system comprising:

an image acquisition device configured to perform an imaging operation on a substrate or plurality of substrates to obtain a set of images, each image representing a different instance of the pattern; and a computer system configured to: register the set of images relative to each other to superimpose the instances of the pattern; and measure variation in the pattern using the registered set of images, wherein: each image in the received set of images is delimited by a boundary box; the registration of the set of images comprises setting a common boundary box for the set of images based on an intersection between the boundary boxes of the received set of images; and the registration of the set of images is performed using all pixels within the common boundary box for each image.

According to another aspect of the invention, there is provided an inspection system for measuring variation across multiple instances of a pattern on a substrate or substrates after a step in a device manufacturing process, the system comprising:

an image acquisition device configured to perform an imaging operation on a substrate or plurality of substrates to obtain a set of images, each image representing a different instance of the pattern; and a computer system configured to register the pattern across the set of images, the pattern comprising a plurality of pattern elements, each pattern element having a weighting that controls the extent to which the pattern element contributes to the registration of the pattern, the registration comprising: determining a variation in at least one pattern element across the set of images using a model describing a patterning process for creating the pattern; and determining a weighting associated with the at least one pattern element based on the determined variation in the pattern element.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3-4 depict inconsistent labeling of objects in different images;

FIGS. 5-6 depict inconsistent boundary boxes in different images;

FIGS. 7-8 depict inconsistent splitting of an object in different images;

DETAILED DESCRIPTION OF EXEMPLARY EMBODIMENTS

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Figure 1:
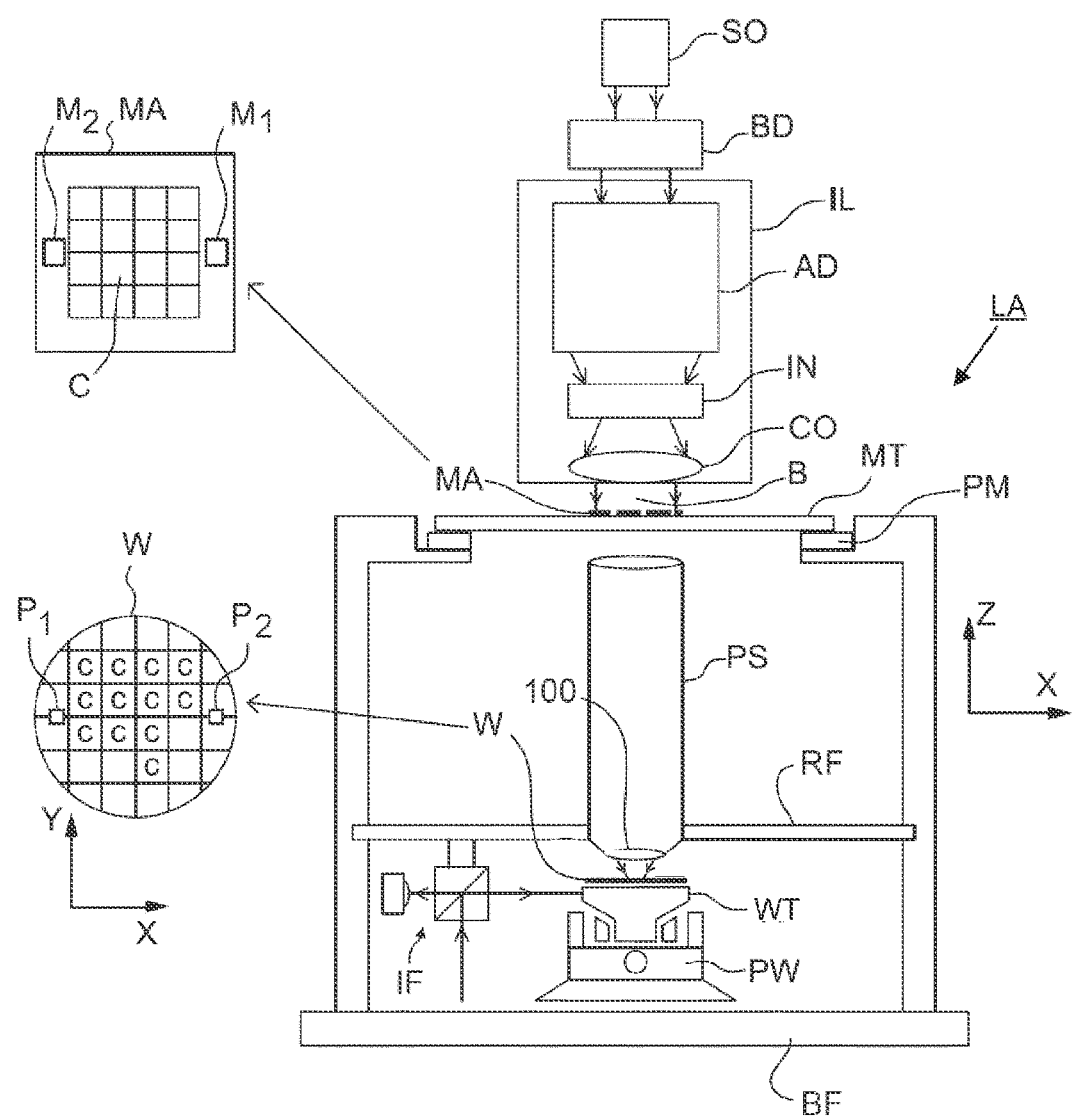
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing various types of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

In this embodiment, for example, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables and, for example, two or more mask tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (which are commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
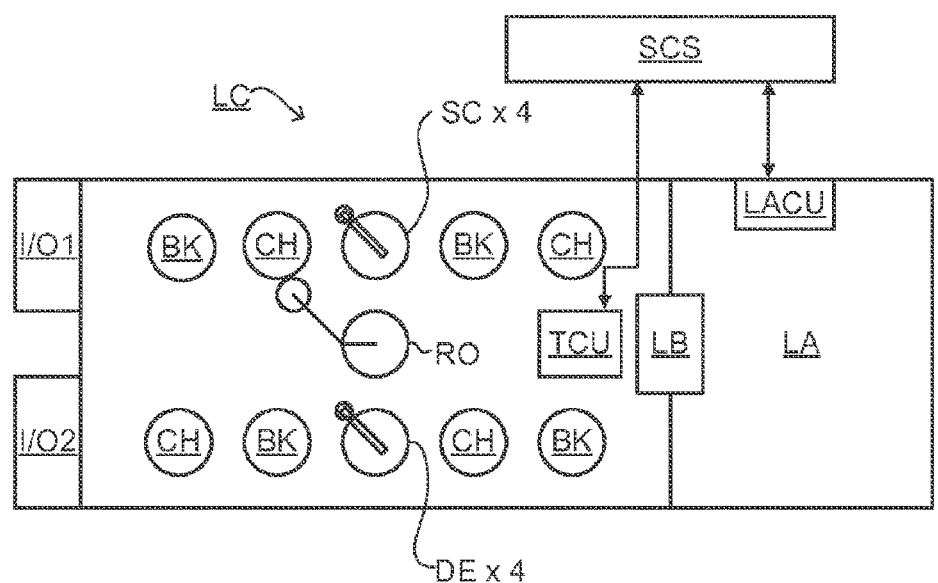
FIG. 2 depicts a lithographic cell or cluster.

As shown in FIG. 2 the lithographic apparatus LA forms part of a lithographic cell LC, also sometimes referred to as a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports 1/O1, 1/O2, moves them between the different process apparatus and delivers then to the loading bay LB of the lithographic apparatus. These devices, which are often collectively referred to as the track, are under the control of a track control unit TCU that is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments, for example, can be made to exposures of subsequent substrates, especially if the inspection can be done soon and fast enough that other substrates of the same batch are still to be exposed. Also, already exposed substrates may be stripped and reworked to improve yield, or possibly be discarded, thereby avoiding performing exposures on substrates that are known to be faulty. In a case where only some target portions of a substrate are faulty, further exposures can be performed only on those target portions that are deemed to be non-faulty.

An inspection apparatus, which may also be referred to as a metrology apparatus, is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast, as in there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) that is customarily the first step carried out on exposed substrates and increases the contrast between exposed and unexposed parts of the resist. At this stage, the image in the resist may be referred to as semi-latent. It is also possible to make measurements of the developed resist image, at which point either the exposed or unexposed parts of the resist have been removed, or after a pattern transfer step such as etching. The latter possibility limits the possibilities for rework of faulty substrates but may still provide useful information.

It is desirable to measure variation across multiple instances of a pattern, for example a set of nominally identical patterns, on the same substrate, or between different substrates, after a step in a device manufacturing process, for example a device manufacturing method that includes one or more lithographic steps. The multiple instances may be measured after any step in the device manufacturing process, including steps involving exposure of the substrate and other processing steps such as post-exposure bake, developing, and subsequent pattern formation steps such as etching, chemical mechanical planarization (CMP), and filling/deposition (e.g. using chemical vapor deposition, CVD). The multiple instances may be formed at different positions on the same substrate, on different substrates, or a combination of both. Nominally identical patterns are patterns which would be identical (and identically positioned) if the relevant steps of the device manufacturing process were error free. Nominally identical patterns will normally comprise patterns that are formed at the same stage of a lithographic process (e.g. before etching or after etching). Parameters which are of particular interest when measuring the variation include line edge roughness and line width roughness, but other parameters may also be measured, including parameters related to placement of features in the pattern (e.g. differences between expected edge positions and measured edge positions). The measured variation provides information about errors in the device manufacturing process. This information can be used to improve the device manufacturing process and thereby improve patterning robustness.

Measuring variation involves comparing different instances of a pattern. The comparison typically comprises registering (aligning) different instances of the pattern relative to each other to computationally superimpose the different instances.

A known approach for implementing registration is to align different images based on calculating the center of gravity of a selected subset of features in each image. The calculated centers of gravity are then used to perform the registration (e.g. by aligning the centers of gravity as closely as possible). This approach is computationally efficient but prone to error. Examples of factors contributing to error are discussed below with reference to FIGS. 3-12.

As illustrated in FIGS. 3 and 4, corresponding objects in different images may erroneously be given different IDs. In the simple case depicted, an image comprises two objects 11 and 12 within a boundary box 10. The objects 11 and 12 are, however, labelled differently in the image of FIG. 3 in comparison with the image of FIG. 4. Such labelling errors cause relatively large shifts in the apparent center of gravities of the objects affected even though the objects themselves may be stable (i.e. well aligned over the set of images being processed).

As illustrated in FIGS. 5 and 6, objects that are fully visible in one image may not be fully visible in all images being compared. In the case depicted, objects 11 and 12 are fully visible in the image of FIG. 5 but only object 12 is fully visible in the image of FIG. 6. The object 11 near the edge of the boundary box 10 in FIG. 5 is partially cut-off by the boundary box 10 in FIG. 6. The boundary box 10 in FIG. 6 is displaced relative to the boundary box 10 of FIG. 5 (depicted by a broken line in FIG. 6). Variation in the positioning of the boundary box 10 (which may be defined for example by the field of view of the image acquisition device used to obtain the image) relative to objects within the boundary box 10 may arise for example due to variations in the accuracy of a stage used to support the substrate and/or due to errors in pattern recognition algorithms used to identify the patterns to be compared. Variations in the extent to which objects are visible will lead to a corresponding variation in the positions of centers of gravity allocated to such objects even though the objects themselves may be stable.

Figure 9:
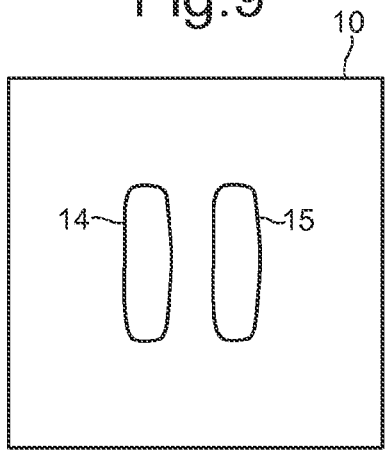
FIGS. 9-10 depict inconsistent joining of separate objects in different images.
Figure 10:
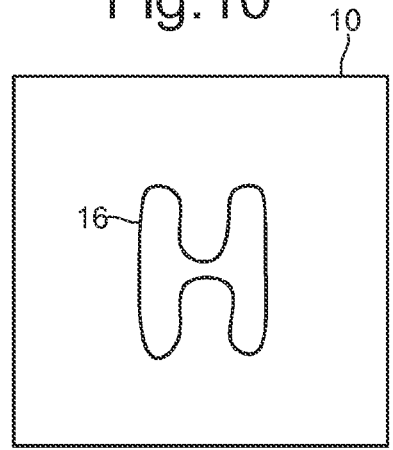

As illustrated in FIGS. 7-10, variation in the lithographic process may cause objects to be erroneously split into multiple objects in a subset of the images (FIGS. 7 and 8) or may cause plural objects to be erroneously joined together to form a single object in a subset of the images (FIGS. 9 and 10). In the example shown in FIGS. 7 and 8, a single object 13 is present in the boundary box 10 of FIG. 7, but the same object is split into two separate objects 13A and 13B in the boundary box 10 of FIG. 8. If the image of FIG. 7 is analyzed to determine a center of gravity of the object 13, a single point will be determined that is located roughly in the neck region of the object 13. By contrast, if the image of FIG. 8 is analyzed to determine a center of gravity, two distinct objects 13A and 13B will be identified, each having its own center of gravity that is displaced significantly relative to the position of the center of gravity of the object 13 of FIG. 7. Similar considerations apply to the example shown in FIGS. 9 and 10, where two separate objects 14 and 15 (with two corresponding centers of gravity) are present in the image of FIG. 9 but are present as a single object 16 (with a single center of gravity) in the image of FIG. 10. Such splitting or joining of objects causes artificial shifts in the centers of gravity involved, resulting in errors in the registration of the images.

Figure 11:
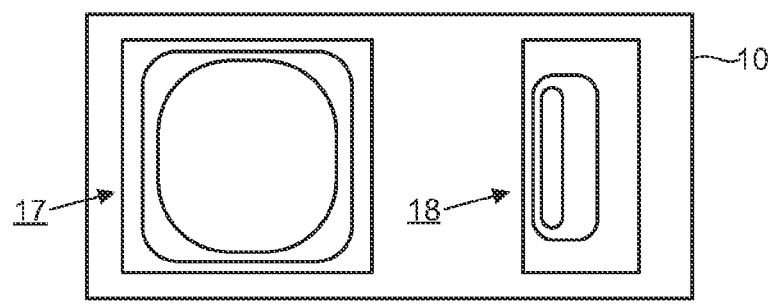
FIGS. 11-12 illustrate how apparent variations in objects can vary according to the choice of which objects to use for registration.
Figure 12:
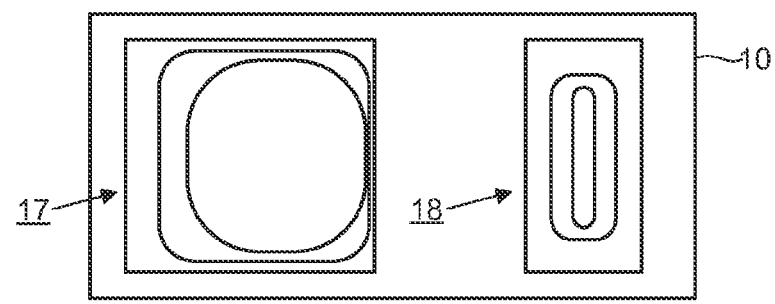

A further source of error when using centers of gravity of selected objects is that some objects are more susceptible to variation between different images than other objects. This means that the choice of which objects to use for the registration procedure can have a significant effect on the accuracy of the registration and, therefore, on measurements of variation in the pattern that rely on the registration. In particular, if an object having high variation is used for the registration, variations in the position of this object may cause other objects to appear variable when they are in fact relatively stable. The variation in the object used for the registration is thus effectively transferred to other objects in the pattern. This effect is illustrated in FIGS. 11 and 12, which each show stacking of the same set of images containing two objects 17 and 18 after registration. Three schematic contour lines are shown for each object 17 and 18 to indicate relative variation in the outer edge of each object. FIG. 11 depicts the case where the set of images are registered using the object 17 as an anchor (e.g. based on the center of gravity of the object 17). FIG. 12 depicts the case where the set of images are registered using object 18 as the anchor. It can be seen that the choice of anchor has a marked effect on the apparent variability of the two objects 17 and 18. In FIG. 11, apparent variation along the right hand side of object 18 in enhanced. In FIG. 12, apparent variation along the left hand side of object 17 is enhanced.

Figure 13:
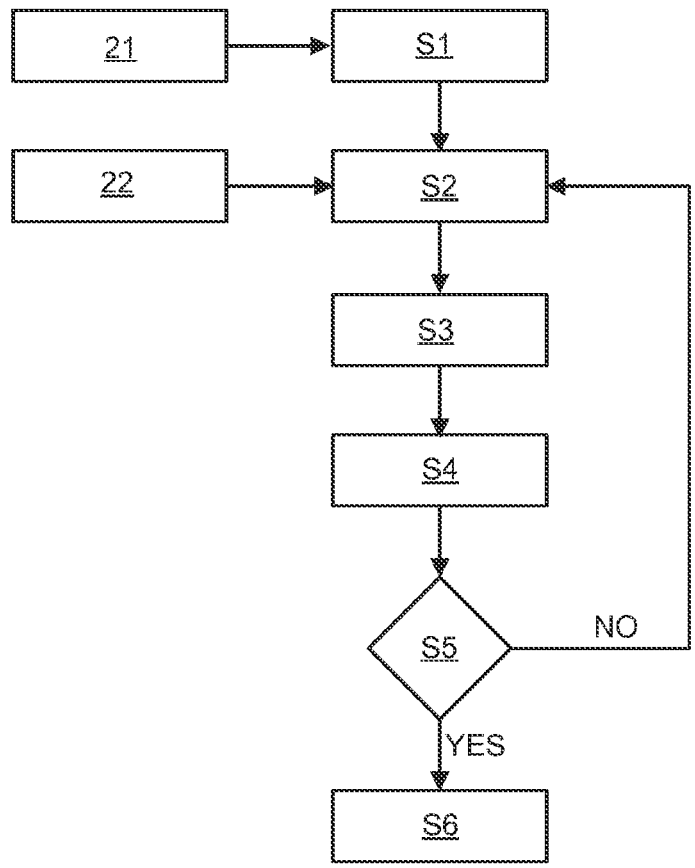
FIG. 13 depicts an iterative method of measuring variation between nominally identical patterns.

FIG. 13 is a flow chart depicting a method according to an embodiment which addresses the problems discussed above. The method measures variation across multiple instances of a pattern on a substrate or substrates after a step in a device manufacturing process. The multiple instances of the pattern may comprise multiple instances of a nominally identical pattern. Alternatively or additionally, the multiple instances of the pattern may comprise multiple instances of the pattern with a degree of deliberately added variation in the pattern. For example, variation in the pattern may be deliberately induced by varying patterning process parameters such as focus or dose. In this way the measured variation may be used to evaluate pattern stability as a function of patterning process parameters. For example, a focus and/or dose range over which variation in the pattern is measured to be within an acceptable range may be used to determine best focus or best dose values or ranges. In an embodiment, the device manufacturing method comprises one or more lithographic steps.

In step S1, data representing a set of images is received. In the example shown the data is received from a database 21. In other embodiments the data is received directly from an image acquisition device. The image data may be derived from measurements performed by a scanning electron microscope (SEM) for example. Each image represents a different instance of the pattern. The different instances correspond to the pattern formed at different positions on a substrate and/or on different substrates. The substrate or substrates may comprise semiconductor wafers patterned by a semiconductor device manufacturing process.

The method comprises registering the set of images relative to each other. The registration comprises aligning or superimposing (stacking) the images so that they can be compared to identify variations between the different instances. In an embodiment, an initial coarse registration may be performed in step S1 based on a standard pattern matching algorithm. The coarse registration may comprise alignment of an SEM image (or a binary version of the SEM image) relative to a data file defining a mask pattern (e.g. GDSII). The coarse registration may be used to determine initial positions of boundary boxes of the images (e.g. the positions of the boundary boxes when the images are aligned with each other) in order to determine a common boundary box corresponding to an intersection between the boundary boxes, as described further below. In subsequent steps weightings can be used to improve the registration. In the example of FIG. 13, further registration steps comprise an iterative sequence including steps S2-S5. In other embodiments, the further registration may be performed without iteration.

The pattern, for example nominally identical pattern, comprises a plurality of pattern elements. In an embodiment, one or more of the pattern elements each comprises all or a portion of an edge defining an object in the pattern. The object may be defined by an edge forming a closed contour within the image (e.g. object 12 in FIG. 6), or by an edge forming an open contour within the image, not including the boundary box itself (e.g. due to the object overlapping with a boundary box 10 of the image, as is the case for object 11 in FIG. 6).

In an embodiment, the registration of the images comprises applying different weightings to two or more of the plurality of pattern elements. The different weightings may comprise discrete numerical values or a continuous weighting function. The weightings control the extent to which each pattern element contributes to the registration of the set of images. Each weighting is based on an expected variation of the pattern element to which the weighting is applied. In an embodiment, the weightings are such that pattern elements having relatively high expected variation contribute less to the registration of the set of images than pattern elements having lower expected variation.

The weightings can be derived in an automated process, for example based on physics principles or knowledge of pattern formation processes. In an embodiment, the expected variation of each pattern element is obtained using a model describing a patterning process for creating the pattern. The expected variation of each pattern element is used to obtain the weighting for that pattern element. For example, in an embodiment, the method comprises determining a variation in at least one pattern element using the model and determining a weighting associated with the at least one pattern element based on the determined variation in the pattern element. This registration process is used here in the context of measuring variations of a pattern across a set of images but the registration process may also be provided as a stand alone process. In this case the pattern may be registered in one or a set of images, for example relative to a reference pattern.

The model may take into account physics principles or knowledge of pattern formation processes. In an embodiment the expected variation of each pattern element is obtained by modeling the pattern element at different patterning process parameters, for example under different dose or focus conditions. In an embodiment, the model comprises a model of a lithographic process.

The use of weightings makes it possible to reduce the extent to which pattern elements of relatively high variability contribute to the registration process and thereby cause errors in the registration process. The use of weightings reduces or removes the need to manually intervene in the registration process, for example to manually exclude regions which are not suitable for registration. The use of weightings also makes it possible for pattern elements having low variability to contribute more to the registration process than they otherwise would, thereby further reducing errors in the registration process. Reducing errors in the registration process improves the accuracy of measurements of variation in the nominally identical pattern. Detected variation is more likely to be due to real variation than variation induced by erroneous registration of the images.

In the embodiment of FIG. 13, the weightings are generated and applied to the pattern elements in step S2. Information about the expected variation of the pattern elements may be supplied by database 22. Alternatively or additionally, information about the expected variation may be provided from measurements of the variation in the set of images themselves via the NO branch of step S5. For example, in an embodiment, the first time step S2 is performed the weightings are set equal for all pattern elements. Step S3 then registers the set of images based on the equal weightings and a first measurement of variation is performed in the following step S4. The method then follows the NO branch of step S5 and the step S2 then uses the variation in the pattern measured in the preceding step S4 to generate the first set of weightings to improve the registration process.

In step S3, registration of the set of images relative to each other is performed using the weightings generated and applied in step S2 (if weightings are not set to be equal—see above). Various algorithms known in the art of pattern matching may be used for the registration. In one particular embodiment, as described further below, cross-correlation is used to match each image to a common reference image. Examples of common reference images are given below.

In step S4, variation in the pattern is measured over the set of images, as registered in step S3. Various metrics may be used to quantify the variation. In one particular embodiment, a metric quantifying variation in transformation fields embodying determined transformations between the images and a common reference image are used, as described further below.

In step S5, the output from step S4 is tested to determine whether the iterative process has converged to a satisfactory extent. This may be achieved for example by comparing the current output from step S4 with a preceding output from S4. If a difference between the outputs is larger than a predetermined threshold, the method proceeds via the NO branch of step S5 to perform a further iteration (otherwise the method proceeds via the YES branch). In such a further iteration, information about variation in the set of images is used to refine the weightings applied in step S2. For example, pattern elements which have been found in step S4 to have relatively high variation may be down-weighted and/or pattern elements which have been found in step S4 to have relatively low variation may be up-weighted. The process then continues until the YES branch of step S5 is encountered and the method proceeds to step S6. In step S6, the measured variation in the pattern is output.

The method of FIG. 13 is thus an example of an embodiment in which the registering of the set of images comprises an iterative process involving at least a first registration step (the first time step S3 is performed) followed by a second registration step (the next time step S3 is performed, after following the NO branch of step S5). Each of the first registration step and the second registration step comprises registering the set of images relative to each other to superimpose the instances of the pattern. At least the second registration step comprises applying different weightings to two or more pattern elements. One or more weightings used in the second registration step are generated using variation determined (in step S4 in this example) using the registration of the first registration step. The first registration step may or may not use different weightings for different pattern elements.

Information about the expected variation of the pattern elements, as supplied for example via the database 22 in the method of FIG. 13, may be obtained in various ways. It has been described above for example how the expected variation may be obtained using a model describing a patterning process for creating the pattern. Further non-limiting examples are given below, which may or may not involve use of such a model.

In an embodiment, each of one or more of the weightings is generated using a simulated slope of an aerial image intensity (e.g. the normalized image-log slope, NILS) of a lithographic process defining all or a portion of the pattern element. In an embodiment, the weighting varies inversely as a function of the simulated slope of the aerial image intensity. Pattern elements defined by edges having shallower slopes are weighted lower (i.e. such that they contribute less to registration) than pattern elements defined by edges having steeper slopes. Edges corresponding to shallower simulated slopes will be expected to vary more across the set of images than edges corresponding to steeper simulated slopes and will therefore be less optimal for achieved accurate registration.

In an embodiment, each of one or more of the weightings is generated based on a nominal geometry (i.e. a geometry that would be formed if relevant preceding steps of the device manufacturing process were error free) of the pattern element. In an embodiment, the nominal geometry is compared with a library containing different geometries and associated expected variabilities. The expected variabilities may be obtained from calibration measurements, simulations, or general knowledge in the field of lithographic processes. It is well known for example that certain classes of geometry are more difficult to form accurately using lithography than others.

Figure 14:
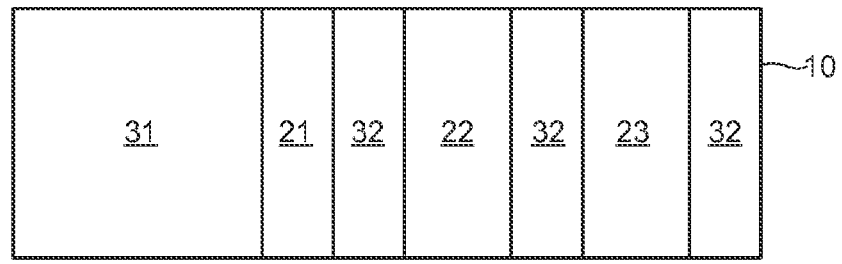
FIGS. 14-15 depict example choices of different weightings for different pattern elements.
Figure 15:
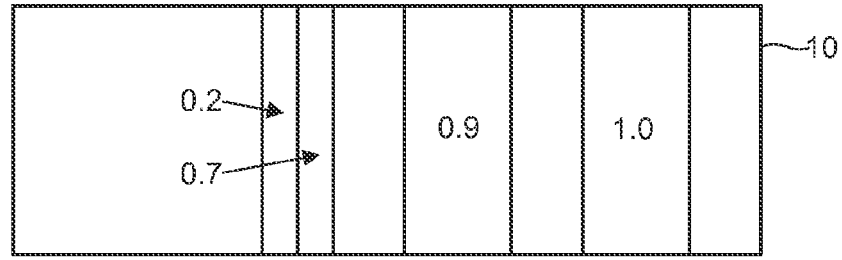

In an embodiment, each of one or more of the weightings is generated based on a property of the pattern environment adjacent to the pattern element. For example, it is known that variation of an edge is likely to be higher when the edge is located adjacent to an open space in comparison to when the edge is located adjacent to a denser region of pattern. Thus, in an embodiment the pattern element forms part of an object in the pattern and the property of the pattern environment comprises the length in a direction perpendicular to an edge of the object in which no other object is present. The property of the pattern environment may comprise a line separation for example in the case of a 1D pattern of lines. The property of the pattern environment may alternatively or additionally comprise a measure of the pattern density adjacent to the pattern element. An approach to generating weightings of this type is illustrated in FIGS. 14 and 15. FIG. 14 depicts a pattern within a bounding box 10. The pattern depicts three objects 21, 22 and 23 consisting of parallel vertical lines. Object 21 is a relative thin line having an open area 31 on the left and a series of denser lines on the right. The denser lines include objects 22 and 23 and are separated from each other by smaller open areas 32. It is known that an object 21 adjacent to an open area 31 will often be more difficult to form accurately than objects 22 and 23 in denser regions because of a greater sensitivity to process variations. The greater sensitivity to process variations may arise for example due to a lower aerial image contrast or slope of intensity. The object 21 will therefore be expected to have a larger variation across the set of images, particularly on the left hand side of the object 21, than the other objects 22 and 23. This knowledge of the expected variation can be used to choose weightings that improve the registration process. FIG. 15 shows an example choice of weightings. A left half of the object 21 is given a relatively low weighting of 0.2. The right half of object 21 is given a higher weighting 0.7, reflecting the fact that the objects 22 and 23 will tend to assist with accurate formation of the right hand side of object 21. Objects 22 and 23 are given still higher weightings of 0.9 and 1.0.

Figure 20:
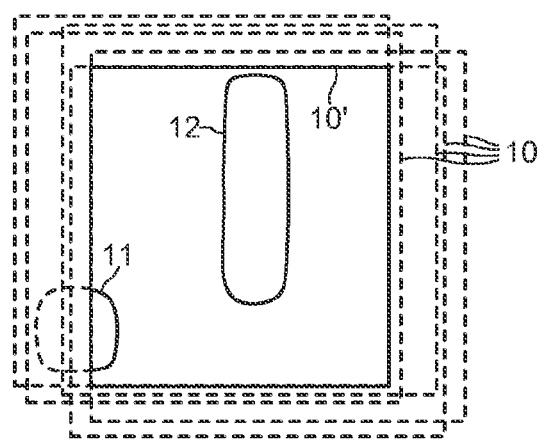
FIG. 20 depicts derivation of a common boundary box using an intersection between boundary boxes of a set of images.

In an embodiment, each image in the received set of images is delimited by a boundary box 10. The boundary box 10 may be defined for example by an imaging process (e.g. SEM) used to obtain the image (e.g. a field of view of the imaging process) or by subsequent processing of the image. The boundary box may be defined by or equal to a field of view of the imaging process. In an embodiment, as depicted schematically in FIG. 20, the registration of the set of images comprises setting a common boundary box 10' for the set of images based on an intersection between the boundary boxes 10 of the received set of images. In an embodiment, the common boundary box 10' is equal to the intersection between the boundary boxes 10. In an embodiment, a coarse registration step of the images is performed in order to define initial positions of the boundary boxes 10 in order to calculate the intersection between the boundary boxes. Setting a common boundary box, which is the same for all of the images, improves accuracy of the registration process by reducing the extent to which variations in the boundary boxes of the set of images can be misinterpreted as variation in the pattern. The shape of the boundary box 10' is not particularly limited, but may typically be rectangular or square.

In an embodiment, the registration of the set of images is performed using all pixels within the common boundary box for each image. The problems with prior art approaches that use only selected features of each image to perform the registration, for example to obtain centers of gravity of closed objects as discussed above, are therefore reduced or avoided. In particular, the reduction in accuracy caused by performing registration based on pattern elements with high variability are reduced. Using all of the pixels within the common boundary box for each image reduces the influence of pattern elements with high variability on the final registration. The influence of such pattern elements may be reduced further by down-weighting such elements, as described above with reference to FIG. 13, but the advantages of using all of the pixels within the common boundary box for each image are achieved even without applying weightings. Thus, in the case where the registration is performed using all of the pixels within the common boundary box for each image, methodology of the type depicted in FIG. 13 could be implemented without steps S2 and S5.

In an embodiment, the registration of the set of images is performed by reference to a mathematical transformation of each image to a common reference image. The registration may for example comprise minimizing a mathematical transformation by varying a position of each image relative to the common reference image until a best fit is obtained. In one particular class of embodiments the registration of the set of images is performed using a cross-correlation in Fourier space. The cross-correlation may be performed with an upsampled matrix-multiplication discrete Fourier transform (DFT) to achieve arbitrary subpixel precision. In a case where weightings are applied to different pattern elements in an image, the registration may for example comprise comparing a binary image (consisting of only $\{0,1\}$) with a reference image containing weights per pixel as values in the range of $[0,1]$.

In an embodiment, the measurement of variation comprises calculating a variation across the mathematical transformations for the set of images. In one example, each mathematical transformation is represented by a vector field and may be referred to as a transformation field. The transformation field may comprise vectors joining each participating pixel in the image to a corresponding pixel in the common reference image. Calculating variations in a transformation field can be achieved more efficiently and consistently than prior art alternatives such as characterizing variation by reference to normals to an average contour.

In an embodiment, the common reference image comprises one or more of the following: a selected one of the set of images being processed, an intended pattern to be formed, or a mask pattern or image of a lithographic process in the device manufacturing process. The intended pattern to be formed may be defined by a data file such as a GDSII file and may or may not contain optical proximity correction features.

Figure 16:
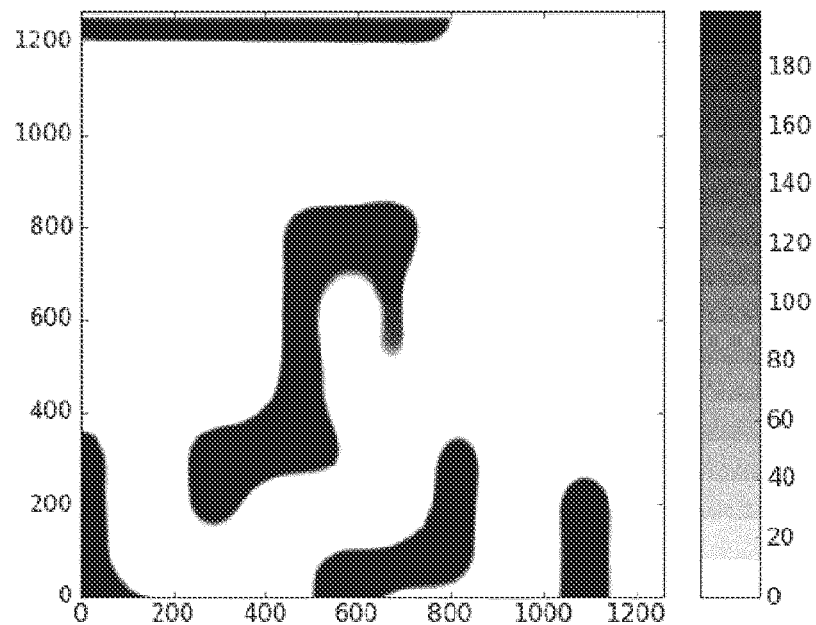
FIGS. 16-17 depict stacking of a set of images registered according to an embodiment.
Figure 17:
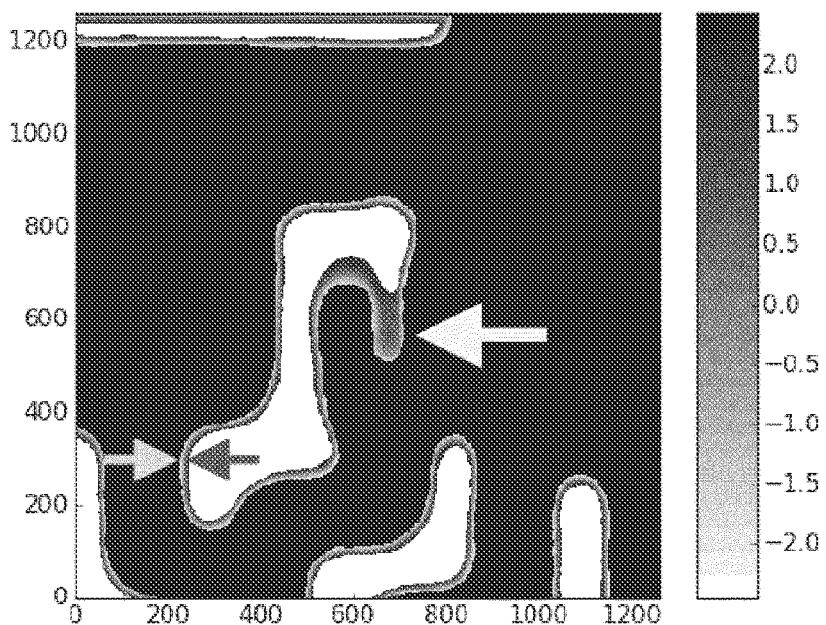
Figure 18:
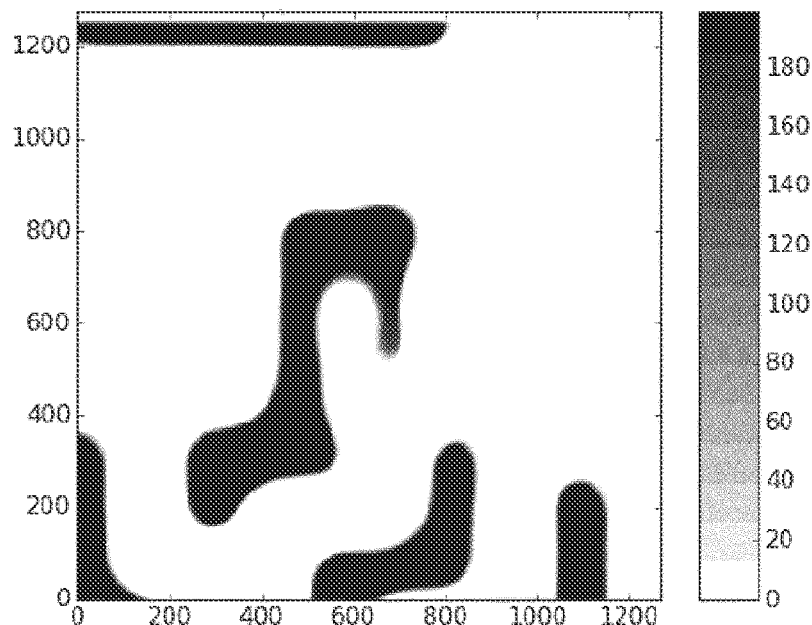
FIGS. 18-19 depict stacking of the set of images of FIGS. 16 and 17 registered using the center of gravity of objects in the images.
Figure 19:
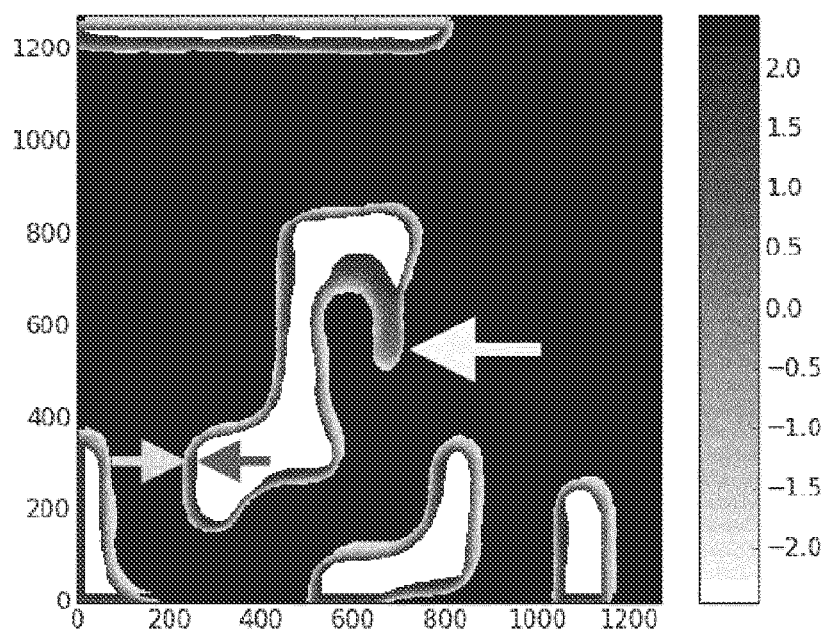

FIGS. 16 and 17 depict registration of a set of 199 images according to an embodiment in which all pixels in a common boundary box for each image are used for the registration. FIGS. 18 and 19 depict registration of the same 199 images using a standard center of gravity based alignment. FIGS. 16 and 18 depict stacking of the registered set of images using a linear shading scale (from 1-199). FIGS. 17 and 19 depict the same stacking but with a non-linear scaling which increases the visibility of variations. The scaling represents a multiple of a standard deviation away from a mean. Thus, 0.0 corresponds to a mean value, 2.0 corresponds to twice a standard deviation greater than the mean, and −2.0 corresponds to twice a standard deviation less than the mean. The range of −2.0 to 2.0 shown thus covers about 95% of the contours.

The stacking shown in FIGS. 16 and 18 appears similar but the non-linear scaling of FIGS. 17 and 19 reveals significant differences in performance between the two approaches to registration. In particular, large differences between FIGS. 17 and 19 can be seen in the protruding region indicated by the large arrow. The variation is much larger in FIG. 19 than in FIG. 17. Furthermore, pattern elements which are more stable, such as the portion of the edge of the object indicated by the smaller arrows, are seen to be registered significantly less well in FIG. 19 than in FIG. 17. The width of the edge, which is a measure of apparent variation in this pattern element across the registered set of images, is significantly larger in FIG. 19 than in FIG. 17. The increased width is likely due to variations in regions such as that indicated by the large arrow effectively transferring variation to other more stable regions by reducing the accuracy of the registration process for those regions.

The nature of each image in the set of images is not particularly limited. In an embodiment, each image is a binary image. The binary image may be obtained for example using an edge detection algorithm. Binary images can be stored and processed efficiently.

Figure 21:
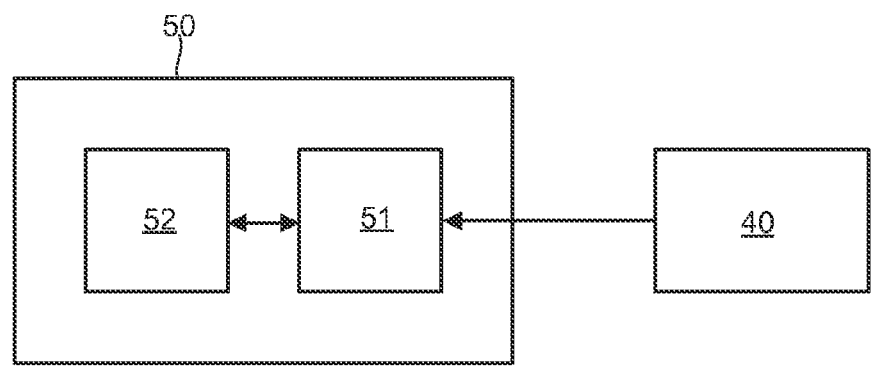
FIG. 21 depicts an inspection system according to an embodiment.

FIG. 21 depicts an inspection system suitable for implementing the method. The inspection system comprises an image acquisition device 40 and a computer system 50. The image acquisition device 40 performs an imaging operation on a substrate or plurality of substrates to obtain the data representing a set of images. The data is provided to a data receiving unit 51 of the computer system 50 and the subsequent processing steps are performed by a data processing unit 52. Computer hardware for implementing such functionality is well known in the art.

The embodiments may further be described using the following clauses:

1. A method of measuring variation across multiple instances of a pattern on a substrate or substrates after a step in a device manufacturing process, the method comprising:
   receiving data representing a set of images, each image representing a different instance of the pattern;
   registering the set of images relative to each other to superimpose the instances of the pattern; and
   measuring variation in the pattern using the registered set of images, wherein:
   the pattern comprises a plurality of pattern elements and the registration of the set of images comprises applying different weightings to two or more of the plurality of pattern elements, the weightings controlling the extent to which each pattern element contributes to the registration of the set of images.

2. The method of clause 1, wherein each weighting is based on an expected variation of the pattern element to which the weighting is applied.
3. The method of clause 1 or 2, wherein each pattern element comprises all or a portion of an edge defining an object in the pattern.
4. The method of clause 2 or clause 3, wherein the weightings are such that a pattern element having a relatively high expected variation will contribute less to the registration of the set of images than a pattern element having a lower expected variation.
5. The method of any of clauses 2 to 4, wherein the expected variation of each pattern element is obtained using a model describing a patterning process for creating the pattern.
6. The method of clause 5, wherein the expected variation of each pattern element is obtained by modeling the pattern element at different patterning process parameters.
7. The method of clause 5 or clause 6, wherein the model comprises a model of a lithographic process.
8. The method of any preceding clause, wherein each of one or more of the weightings is generated using a simulated slope of an aerial image intensity of a lithographic process defining all or a portion of the pattern element in the device manufacturing process.
9. The method of any preceding clause, wherein each of one or more of the weightings is generated based on a nominal geometry of the pattern element.
10. The method of any preceding clause, wherein each of one or more of the weightings is generated based on a property of the pattern environment adjacent to the pattern element.
11. The method of clause 10, wherein each pattern element forms part of an object in the pattern and the property of the pattern environment comprises the length in a direction perpendicular to an edge of the object in which no other object is present.
12. The method of any preceding clause, wherein the registration of the set of images comprises an iterative process involving at least a first registration step followed by a second registration step, the first registration step and the second registration step each comprising registering the set of images relative to each other to superimpose the instances of the pattern; wherein
   at least the second registration step comprises applying different weightings to two or more of the plurality of pattern elements, the weightings controlling the extent to which each pattern element contributes to the registration of the set of images in the second registration step; and
   one or more of the weightings used in the second registration step are generated using variation in the pattern determined using the registration of the first registration step.
13. The method of any preceding clause, wherein each image in the received set of images is delimited by a boundary box;
   the registration of the set of images comprises setting a common boundary box for the set of images based on an intersection between the boundary boxes of the received set of images; and
   the registration of the set of images is performed using all pixels within the common boundary box for each image.
14. A method of measuring variation across multiple instances of a pattern on a substrate or substrates after a step in a device manufacturing process, comprising:

receiving data representing a set of images, each image representing a different instance of the pattern;

registering the set of images relative to each other to superimpose the instances of the pattern; and measuring variation in the pattern using the registered set of images, wherein: each image in the received set of images is delimited by a boundary box;

the registration of the set of images comprises setting a common boundary box for the set of images based on an intersection between the boundary boxes of the received set of images.

15. the method of clause 14, wherein the registration of the set of images is performed using all pixels within the common boundary box for each image.

16. The method of clause 13 or clause 14, wherein the common boundary box is square or rectangular.

17. The method of any preceding clause, wherein the registration of the set of images comprises determining a mathematical transformation of each image to a common reference image.

18. The method of clause 17, wherein the measurement of variation comprises calculating a variation across the determined mathematical transformations for the set of images.

19. The method of clause 17 or clause 18, wherein the common reference image comprises one or more of the following: a selected one of the set of images, an intended pattern to be formed, or a mask pattern of a lithographic process in the device manufacturing process.

20. The method of any preceding clause, wherein each image in the set of images comprises a binary image.

21. The method of any preceding clause, wherein the multiple instances of a pattern comprise multiple instances of a nominally identical pattern.

22. The method of any preceding clause, wherein the device manufacturing process comprises one or more lithographic steps.

23. A method of registering a pattern in one or more images, the pattern comprising a plurality of pattern elements, each pattern element having a weighting that controls the extent to which the pattern element contributes to the registration of the pattern, the method comprising:

determining a variation in at least one pattern element using a model describing a patterning process for creating the pattern; and determining a weighting associated with the at least one pattern element based on the determined variation in the pattern element.

24. The method of clause 23, wherein the determining of the variation in the at least one pattern element comprises modelling the at least one pattern element at different patterning process parameters.

25. The method of clause 23 or clause 24, wherein the model comprises a model of a lithographic process.

26. The method of any preceding clause, wherein one or more of the images comprises a scanning electron microscope image of the pattern on a semiconductor wafer produced in a device manufacturing process.

27. An inspection system for measuring variation across multiple instances of a pattern on a substrate or substrates after a step in a device manufacturing process, comprising:

an image acquisition device configured to perform an imaging operation on a substrate or plurality of substrates to obtain a set of images, each image representing a different instance of the pattern; and a computer system configured to:

register the set of images relative to each other to superimpose the instances of the pattern; and measure variation in the pattern using the registered set of images, wherein:

the pattern comprises a plurality of pattern elements and the registration of the set of images comprises applying different weightings to two or more of the plurality of pattern elements, the weightings controlling the extent to which each pattern element contributes to the registration of the set of images.

28. The inspection system of clause 27, wherein each weighting is based on an expected variation of the pattern element to which the weighting is applied.

29. An inspection system for measuring variation across multiple instances of a pattern on a substrate or substrates after a step in a device manufacturing process, comprising:

an image acquisition device configured to perform an imaging operation on a substrate or plurality of substrates to obtain a set of images, each image representing a different instance of the pattern; and a computer system configured to:

register the set of images relative to each other to superimpose the instances of the pattern; and measure variation in the pattern using the registered set of images, wherein: each image in the received set of images is delimited by a boundary box;

the registration of the set of images comprises setting a common boundary box for the set of images based on an intersection between the boundary boxes of the received set of images.

30. The inspection system of clause 29, wherein the registration of the set of images is performed using all pixels within the common boundary box for each image.

31. An inspection system for measuring variation across multiple instances of a pattern on a substrate or substrates after a step in a device manufacturing process, comprising:

an image acquisition device configured to perform an imaging operation on a substrate or plurality of substrates to obtain a set of images, each image representing a different instance of the pattern; and a computer system configured to register the pattern across the set of images, the pattern comprising a plurality of pattern elements, each pattern element having a weighting that controls the extent to which the pattern element contributes to the registration of the pattern, the registration comprising:

determining a variation in at least one pattern element across the set of images using a model describing a patterning process for creating the pattern; and determining a weighting associated with the at least one pattern element based on the determined variation in the pattern element.

32. A computer program comprising computer-readable instructions that, when executed by a computer system, cause the computer system to perform the method of any of clauses 1 to 26.

33. A computer system configured to perform the method of any of clauses 1 to 26.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), soft X-ray, as well as particle beams, such as ion beams or electron beams.

The term "lens," where the context allows, may refer to any one or combination of various types of optical components, including refractive, reflective, magnetic, electromagnetic, and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for a pattern in one or more images of a substrate or substrates after a step in a device manufacturing process, the pattern comprising a plurality of pattern elements and each pattern element having associated therewith a weighting that controls the extent to which the pattern element contributes to registration of the pattern, the method comprising:
   determining, by a hardware computer system, a variation in at least one pattern element using a model describing a patterning process for creating the pattern; and
   determining a weighting associated with the at least one pattern element based on the determined variation in the at least one pattern element; and
   registering, based on the weighting, the pattern relative to another pattern.

2. The method of claim 1, wherein each pattern element comprises all or a portion of an edge defining an object in the pattern.

3. The method of claim 1, wherein the weighting is such that a pattern element having a relatively high expected variation will contribute less to the registration than a pattern element having a lower expected variation.

4. The method of claim 1, wherein the variation of the at least one pattern element is obtained by modelling the at least one pattern element at different patterning process parameters.

5. The method of claim 1, wherein the model comprises a model of a lithographic process.

6. The method of claim 1, wherein the weighting is generated using a simulated slope of an aerial image intensity of a lithographic process defining all or a portion of the at least one pattern element in the device manufacturing process.

7. The method of claim 1, wherein:
   the pattern and the another pattern are each delimited by a boundary box;
   the registration comprises setting a common boundary box for the pattern and the another pattern based on an intersection between the boundary boxes of the pattern and the another pattern; and
   the registration is performed using all pixels within the common boundary box for each the pattern and the another pattern.

8. A computer program product comprising a non-transitory computer-readable medium comprising computer-readable instructions therein, the instructions, when executed by a computer system, configured to cause the computer system to at least:
   for a pattern in one or more images of a substrate or substrates after a step in a device manufacturing process, the pattern comprising a plurality of pattern elements and each pattern element having associated therewith a weighting that controls the extent to which the pattern element contributes to registration of the pattern, determine a variation in at least one pattern element using a model describing a patterning process for creating the pattern;
   determine a weighting associated with the at least one pattern element based on the determined variation in the at least one pattern element; and
   register, based on the weighting, the pattern relative to another pattern.

9. An inspection system comprising:
   an image acquisition device configured to perform an imaging operation on a substrate or plurality of substrates to obtain a set of images; and
   the computer program product of claim 8.

10. The method of claim 1, wherein one or more of the one or more images comprises a scanning electron microscope image of the pattern on a semiconductor wafer produced in the device manufacturing process.

11. A method for a pattern in a set of images of a substrate or substrates after a step in a device manufacturing process, wherein each image is delimited by a boundary box, the method comprising:
   setting a common boundary box for the set of images based on an intersection between the boundary boxes of the set of images;

registering, based on the common boundary box and by a hardware computer system, the set of images relative to each other to superimpose the pattern and another pattern; and determining a variation in the pattern using the registered set of images.

12. The method of claim 11, wherein the registration of the set of images is performed using all pixels within the common boundary box for each image.

13. The method of claim 11, wherein the registration of the set of images comprises determining a mathematical transformation of each image to a common reference image.

14. The method of claim 13, wherein the determining the variation comprises calculating a variation across the determined mathematical transformations for the set of images.

15. A computer program product comprising a non-transitory computer-readable medium comprising computer-readable instructions therein, the instructions, when executed by a computer system, configured to cause the computer system to at least:

for a pattern in a set of images of a substrate or substrates after a step in a device manufacturing process, wherein each image is delimited by a boundary box, set a common boundary box for the set of images based on an intersection between the boundary boxes of the set of images;

register, based on the common boundary box, the set of images relative to each other to superimpose the pattern and another pattern; and determine a variation in the pattern using the registered set of images.

16. A method for a pattern in a set of images of a substrate or substrates after a step in a device manufacturing process, wherein each image is delimited by a boundary box, the method comprising:

registering, based on the boundary boxes and by a hardware computer system, the set of images relative to each other to superimpose the pattern and another pattern, wherein the registering is performed by reference to a mathematical transformation of each image to a common reference image; and determining a variation in the pattern using the registered set of images.

17. The method of claim 16, wherein the determining the variation comprises calculating a variation across the determined mathematical transformations for the set of images.

18. The method of claim 16, wherein the registering comprises minimizing a mathematical transformation by varying a position of each image relative to the common reference image until a best fit is obtained.

19. The method of claim 16, wherein the registration of the set of images is performed using a cross-correlation in Fourier space.

20. A computer program product comprising a non-transitory computer-readable medium comprising computer-readable instructions therein, the instructions, when executed by a computer system, configured to cause the computer system to at least:

for a pattern in a set of images of a substrate or substrates after a step in a device manufacturing process, wherein each image is delimited by a boundary box, register, based on the boundary boxes, the set of images relative to each other to superimpose the pattern and another pattern, wherein the registering is performed by reference to a mathematical transformation of each image to a common reference image; and determine a variation in the pattern using the registered set of images.

* * * * *